United States Patent
Lee et al.

(10) Patent No.: US 9,966,359 B2
(45) Date of Patent: May 8, 2018

(54) SEMICONDUCTOR PACKAGE EMBEDDED WITH A PLURALITY OF CHIPS

(71) Applicant: SK hynix Inc., Icheon-si, Gyeonggi-do (KR)

(72) Inventors: Sang Eun Lee, Chuncheon-si (KR); Eun Ko, Seoul (KR); Yong Jae Park, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 160 days.

(21) Appl. No.: 14/969,241

(22) Filed: Dec. 15, 2015

(65) Prior Publication Data

US 2017/0084575 A1    Mar. 23, 2017

(30) Foreign Application Priority Data

Sep. 21, 2015 (KR) .................. 10-2015-0133074

(51) Int. Cl.
*H01L 25/065* (2006.01)
(52) U.S. Cl.
CPC .......... *H01L 25/0652* (2013.01); *H01L 2224/16225* (2013.01); *H01L 2225/06513* (2013.01); *H01L 2225/06555* (2013.01); *H01L 2225/06586* (2013.01); *H01L 2924/181* (2013.01)
(58) Field of Classification Search
CPC .................. H01L 23/31; H01L 23/525
See application file for complete search history.

(56) References Cited

U.S. PATENT DOCUMENTS

| | | | |
|---|---|---|---|
| 6,369,448 B1 * | 4/2002 | McCormick | H01L 25/0652 257/723 |
| 6,740,980 B2 * | 5/2004 | Hirose | H01L 24/11 257/686 |
| 9,123,630 B2 * | 9/2015 | Kim | H01L 25/18 |
| 9,595,513 B2 * | 3/2017 | Fogal | H01L 25/18 |
| 2013/0105558 A1 * | 5/2013 | Abe | B23K 1/0016 228/179.1 |
| 2013/0285237 A1 | 10/2013 | Yu et al. | |
| 2014/0091463 A1 * | 4/2014 | Yu | H01L 24/14 257/738 |
| 2015/0228571 A1 * | 8/2015 | Shiraki | H01L 23/49838 257/701 |

* cited by examiner

*Primary Examiner* — Steven Loke
*Assistant Examiner* — Krista Soderholm
(74) *Attorney, Agent, or Firm* — William Park & Associates Ltd.

(57) ABSTRACT

A semiconductor package may be provided. The semiconductor package may include a substrate. The semiconductor package may include a first semiconductor chip flip-chip bonded to a first surface of the substrate. The semiconductor package may include second semiconductor chips respectively flip-chip bonded to portions of the first surface of the substrate adjacent to both ends of the first semiconductor chip. The semiconductor package may include a third semiconductor chip solder-jointed to the first surface of the substrate covering the first semiconductor chip and portions of the second semiconductor chips.

18 Claims, 6 Drawing Sheets

SEMICONDUCTOR PACKAGE EMBEDDED WITH A PLURALITY OF CHIPS

CROSS-REFERENCE TO RELATED APPLICATION

The present application claims priority under 35 U.S.C. § 119(a) to Korean Patent Application No. 10-2015-0133074 filed in the Korean Intellectual Property Office on Sep. 21, 2015, which is incorporated herein by reference in its entirety.

BACKGROUND

1. Technical Field

Various embodiments generally relate to a semiconductor package, and more particularly, to a semiconductor package embedded with a plurality of chips and a method for manufacturing the same.

2. Related Art

As electronic products are gradually downsized and highly functionalized, semiconductor chips with high capacity are needed to satisfy desired functions. Thus, it is necessary to mount an increased number of semiconductor chips on a small-sized electronic product.

In this regard, technologies for manufacturing semiconductor chips with high capacity or mounting an increased number of semiconductor chips in a limited space has limitations. In this situation, a recent trend is directed to embedding an increased number of semiconductor chips in a single package.

In this regard, various technologies for embedding one or more semiconductor chips in a single package or stacking two or more packages while improving electrical characteristics without increasing the overall thickness of a package are being developed. Recently, electrical connection means between stacked semiconductor chips, TSVs (through-silicon vias), are being highlighted.

SUMMARY

In an embodiment, a semiconductor package may be provided. The semiconductor package may include a substrate. The semiconductor package may include a first semiconductor chip flip-chip bonded to a first surface of the substrate. The semiconductor package may include second semiconductor chips respectively flip-chip bonded to portions of the first surface of the substrate adjacent to both ends of the first semiconductor chip. The semiconductor package may include a third semiconductor chip solder-jointed to the first surface of the substrate covering the first semiconductor chip and portions of the second semiconductor chips.

In an embodiment, a semiconductor package may be provided. The semiconductor package may include a substrate. The semiconductor package may include a first semiconductor chip flip-chip bonded to a first surface of the substrate. The semiconductor package may include wafer level packages respectively flip-chip bonded to portions of the first surface of the substrate adjacent to both ends of the first semiconductor chip. The semiconductor package may include a third semiconductor chip solder-jointed to the first surface of the substrate covering the first semiconductor chip and portions of the wafer level packages.

The substrate may comprise pluralities of first to third bond fingers arranged on the first surface, a plurality of ball lands arranged on a second surface facing away from the first surface, and solder resists respectively formed on the first surface and the second surface in such a way as to expose the first to third bond fingers and the ball lands.

The first bond fingers may be arranged in a second direction along both ends of a center portion of the first surface of the substrate on which the first semiconductor chip is disposed. The second bond fingers may be arranged in the second direction along both ends of the respective portions of the first surface of the substrate on which the wafer level packages are respectively disposed. The third bond fingers may be arranged in the first direction along both ends of a portion of the first surface of the substrate over which the third semiconductor chip is disposed.

The first semiconductor chip may comprise an SoC (system-on-chip) which has a substantially square planar shape.

The first semiconductor chip may have a first active surface facing the first surface of the substrate and a first bottom surface facing away from the first active surface, and may comprise a plurality of first bonding pads arranged in a second direction substantially perpendicular to the first direction along both ends of the first active surface.

The first semiconductor chip further may comprise first connection members formed on the first bonding pads.

The first connection members may comprise bumps.

Each of the wafer level packages may comprise: a second semiconductor chip having a second active surface facing the first surface of the substrate and a second bottom surface facing away from the second active surface, and comprising a plurality of second bonding pads arranged in a second direction along a middle portion of the second active surface; a first insulation layer formed on the second active surface of the second semiconductor chip exposing the second bonding pads; micro bumps formed on the exposed second bonding pads; a plurality of redistribution lines formed on the first insulation layer such that one ends of the redistribution lines are connected with the micro bumps and the other ends of the redistribution lines which are opposite to the one ends are disposed along one end of the first insulation layer which is adjacent to the first semiconductor chip; a second insulation layer formed over the redistribution lines and the first insulation layer exposing the other ends of the redistribution lines; second connection members formed on the exposed other ends of the redistribution lines; and support members arranged in the second direction along the other end of the second insulation layer along which the second connection members are not arranged.

The second bonding pads and the micro bumps may be arranged with a pitch of approximately 20 to approximately 30 μm.

The second connection members may comprise bumps.

The second connection members comprising the bumps may be arranged with a pitch of approximately 50 to approximately 100 μm.

The support members may be formed of substantially the same material and are arranged with the same pitch as the second connection members.

The third semiconductor chip may have a third active surface facing the first surface of the substrate, the first semiconductor chip and the wafer level packages and a third bottom surface facing away from the third active surface, and comprises a plurality of third bonding pads arranged in the first direction substantially perpendicular to the second direction along both ends of the third active surface.

The third semiconductor chip further may comprise third connection members formed on the third bonding pads.

The third connection members may comprise solder balls.

The third connection members comprising the solder balls may be arranged with a pitch of approximately 120 to approximately 450 μm.

The semiconductor package further comprising: an encapsulation member formed on the first surface of the substrate covering the first and third semiconductor chips and the wafer level packages; and a plurality of external connection members formed on a second surface of the substrate facing away from the first surface.

Each of the wafer level packages may have a substantially rectangular plate shape having a length shorter than the first semiconductor chip in the first direction, and having substantially the same length as the first semiconductor chip in a second direction.

In an embodiment, an electronic system may be provided. The electronic system applied with a semiconductor package may include a controller, an interface, an input/output unit and a memory device which are coupled by a bus, and the controller and the memory device may include a semiconductor package. The semiconductor package may include a substrate, and a first semiconductor chip flip-chip bonded to a first surface of the substrate. The semiconductor package may include second semiconductor chips respectively flip-chip bonded to portions of the first surface of the substrate adjacent to both ends of the first semiconductor chip. The semiconductor package may include a third semiconductor chip solder-jointed to the first surface of the substrate covering the first semiconductor chip and portions of the second semiconductor chips.

In an embodiment, a memory card may be provided. The memory card may include a semiconductor package. The semiconductor package may include a memory including a semiconductor package and a memory controller which controls the memory. The semiconductor package may include a substrate, and a first semiconductor chip flip-chip bonded to a first surface of the substrate. The semiconductor package may include second semiconductor chips respectively flip-chip bonded to portions of the first surface of the substrate adjacent to both ends of the first semiconductor chip. The semiconductor package may include a third semiconductor chip solder-jointed to the first surface of the substrate covering the first semiconductor chip and portions of the second semiconductor chips.

DETAILED DESCRIPTION

Hereinafter, a semiconductor package embedded with a plurality of chips will be described below with reference to the accompanying drawings through various examples of embodiments.

Figure 1:
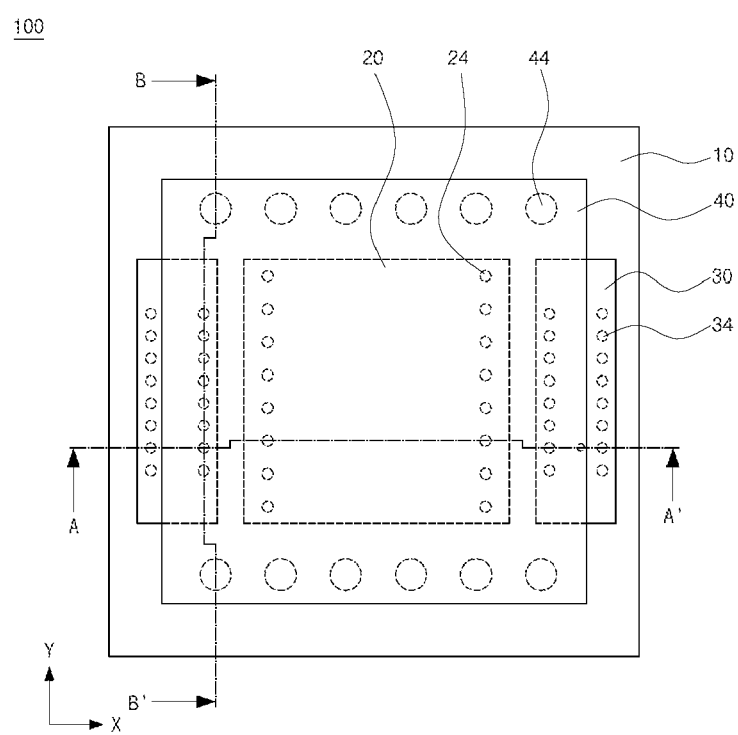
FIG. 1 is a plan view illustrating a representation of an example of a semiconductor package in accordance with an embodiment.
Figure 2:
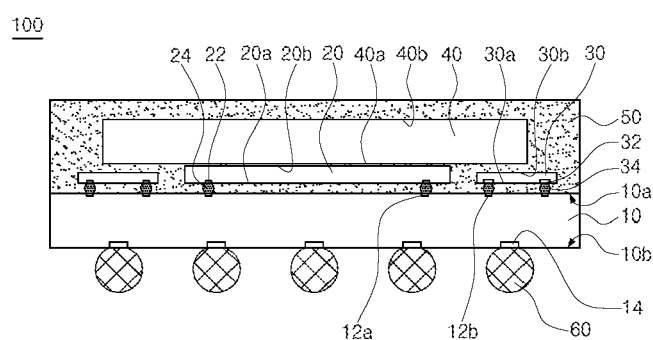
FIG. 2 is a cross-sectional view taken along the line A-A' of FIG. 1.
Figure 3:
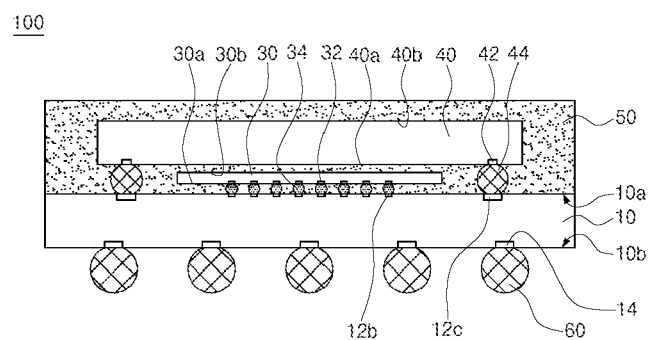
FIG. 3 is a cross-sectional view taken along the line B-B' of FIG. 1.

Referring to FIGS. 1 to 3, a semiconductor package 100 in accordance with an embodiment may include a substrate 10, a first semiconductor chip 20, second semiconductor chips 30, and a third semiconductor chip 40. The semiconductor package 100 in accordance with the embodiment may further include first to third connection members 24, 34 and 44, an encapsulation member 50, and external connection members 60.

The substrate 10 may be a printed circuit board. The substrate 10 may have a substantially quadrangular plate shape when viewed on the top. The substrate 10 may have a first surface 10a which corresponds to a top surface and a second surface 10b which faces away from the first surface 10a and corresponds to a bottom surface. The substrate 10 may include pluralities of first to third bond fingers 12a, 12b and 12c which are arranged on the first surface 10a, and a plurality of ball lands 14 which are arranged on the second surface 10b.

In an embodiment, the first bond fingers 12a may be arranged in a second direction Y perpendicular to a first direction X, along both ends of a portion of the first surface 10a of the substrate 10 on which the first semiconductor chip 20 is to be disposed, when viewed in the first direction X. The second bond fingers 12b may be arranged in the second direction Y along both ends of respective portions of the first surface 10a of the substrate 10 on which the second semiconductor chips 30 are to be respectively disposed, when viewed in the first direction X. The third bond fingers 12c may be arranged in the first direction X along both ends of a portion of the first surface 10a of the substrate 10 over which the third semiconductor chip 40 is to be disposed, when viewed in the second direction Y.

While not illustrated, the substrate 10 may include circuit patterns which are respectively formed on the first surface 10a and the second surface 10b and via patterns which are formed in the substrate 10. The substrate 10 may further include solder resists which are formed on the first surface 10a and the second surface 10b in such a way as to expose the first to third bond fingers 12a, 12b and 12c and the ball lands 14.

The first semiconductor chip 20 may be an SoC (system-on-chip) which includes a logic chip. The first semiconductor chip 20 may have a quadrangular plate shape smaller than the substrate 10. In an embodiment the first semiconductor chip 20 may have a substantially square planar shape. The first semiconductor chip 20 may have a first active surface 20a and a first bottom surface 20b which faces away from the first active surface 20a. The first semiconductor chip 20 may include a plurality of first bonding pads 22 which are arranged in the second direction Y along both ends of the first active surface 20a when viewed in the first direction X. The first semiconductor chip 20 may be flip-chip bonded to the first surface 10a of the substrate 10 by the first connection members 24 which are formed on the first bonding pads 22, such that the first active surface 20a faces the first surface 10a of the substrate 10.

The first connection members 24 may be bumps such as copper pillar bumps or solder bumps. Accordingly, in the semiconductor package 100 in accordance with an embodiment, the first semiconductor chip 20 may be physically secured to the first bond fingers 12a of the substrate 10 by the first connection members 24 including bumps, and may be electrically connected with the first bond fingers 12a of the substrate 10.

The second semiconductor chips 30 may be memory chips. Each of the second semiconductor chips 30 may have a substantially rectangular plate shape. For example, each of the second semiconductor chips 30 may have a length shorter than the first semiconductor chip 20 in the first direction X, and may have the same length as the first semiconductor chip 20 in the second direction Y. Each of the second semiconductor chips 30 may have a second active surface 30a and a second bottom surface 30b which faces away from the second active surface 30a. Each of the second semiconductor chips 30 may include a plurality of second bonding pads 32 which are arranged in the second direction Y along both ends of the second active surface 30a when viewed in the first direction X. The second semiconductor chips 30 may be flip-chip bonded to the first surface 10a of the substrate 10 by the second connection members 34 which are formed on the second bonding pads 32, such that the second active surfaces 30a of the second semiconductor chips 30 face the first surface 10a of the substrate 10 while the second semiconductor chips 30 are respectively disposed adjacent to both ends of the first semiconductor chip 20 when viewed in the first direction X.

The second connection members 34 may be bumps such as copper pillar bumps or solder bumps, in the same manner or substantially the same manner as the first connection members 24. The second connection members 34 including bumps may have substantially the same diameter as the first connection members 24, but may be arranged with a pitch shorter than the first connection members 24. In an embodiment, the second connection members 34 may be arranged with a pitch of approximately 50 to approximately 100 µm. Accordingly, in the semiconductor package 100 in accordance with an embodiment, the second semiconductor chips 30 may be physically secured to the second bond fingers 12b of the substrate 10 by the second connection members 34 including bumps, and may be electrically connected with the second bond fingers 12b of the substrate 10.

Since the second connection members 34 are arranged with the pitch of approximately 50 to approximately 100 µm, it may be understood that the second bonding pads 32 of the second semiconductor chips 30 and the second bond fingers 12b of the substrate 10 are also arranged with a pitch of approximately 50 to approximately 100 µm.

The third semiconductor chip 40 may be a memory chip. The third semiconductor chip 40 may have a substantially quadrangular plate shape. The third semiconductor chip 40 may have a size that covers the first semiconductor chip 20 and portions of the second semiconductor chips 30 which are adjacent to the first semiconductor chip 20. The third semiconductor chip 40 may have a third active surface 40a and a third bottom surface 40b which faces away from the third active surface 40a. The third semiconductor chip 40 may include a plurality of third bonding pads 42 which are arranged in the first direction X along both ends of the third active surface 40a when viewed in the second direction Y.

The third semiconductor chip 40 may be flip-chip bonded to the first surface 10a of the substrate 10 by the third connection members 44 which are formed on the third bonding pads 42, such that the third active surface 40a faces the first surface 10a of the substrate 10, the first bottom surface 20b of the first semiconductor chip 20 and the second bottom surfaces 30b of the second semiconductor chips 30. When viewed on the top, the third semiconductor chip 40 covers the first semiconductor chip 20 and the portions of the second semiconductor chips 30.

The third connection members 44 may include solder balls. The third connection members 44 may be arranged with a pitch larger than the first connection members 24. In an embodiment, the third connection members 44 including solder balls may be arranged with a pitch of approximately 120 to approximately 450 µm. Accordingly, in the semiconductor package 100 in accordance with an embodiment, the third semiconductor chip 40 may be physically secured to the third bond fingers 12c of the substrate 10 by the third connection members 44 including solder balls, and may be electrically connected with the third bond fingers 12c of the substrate 10.

Since the third connection members 44 are arranged with the pitch of approximately 120 to approximately 450 µm, it may be understood that the third bonding pads 42 of the third semiconductor chip 40 and the third bond fingers 12c of the substrate 10 are also arranged with a pitch of approximately 120 to approximately 450 µm.

The encapsulation member 50 may be formed of an epoxy molding compound. The encapsulation member 50 may be formed on the first surface 10a of the substrate 10 through a molding process in such a way as to cover the first to third semiconductor chips 20, 30 and 40.

The external connection members 60 may be mounting means to an external circuit, for example, a module substrate or a system board, and may be formed on the ball lands 14 which are arranged on the second surface 10b of the substrate 10. The external connection members 60 may include solder balls. In an embodiment, the external connection members 60 may include conductive pastes or conductive pins.

As is apparent from the above descriptions, since the semiconductor package in accordance with the embodiments have a structure in which chips disposed at a lower position are flip-chip bonded by bumps and a chip disposed at an upper position is solder-jointed by solder balls, it is possible to obviate the need of forming TSVs as electrical connection means among stacked chips. As a consequence, in a semiconductor package in accordance with an embodiment, since it is possible to avoid formation of TSVs in respective chips, cost increase may be prevented when compared to a package structure which adopts TSVs as electrical connection means among chips, and easiness and reliability in terms of processing may be secured.

Moreover, in a semiconductor package in accordance with an embodiment, a plurality of chips may be embedded, and, in particular, both a memory chip and a driving chip may be embedded. Accordingly, a semiconductor package in accordance with an embodiment may operate at a high speed while having a high capacity.

Figure 4:
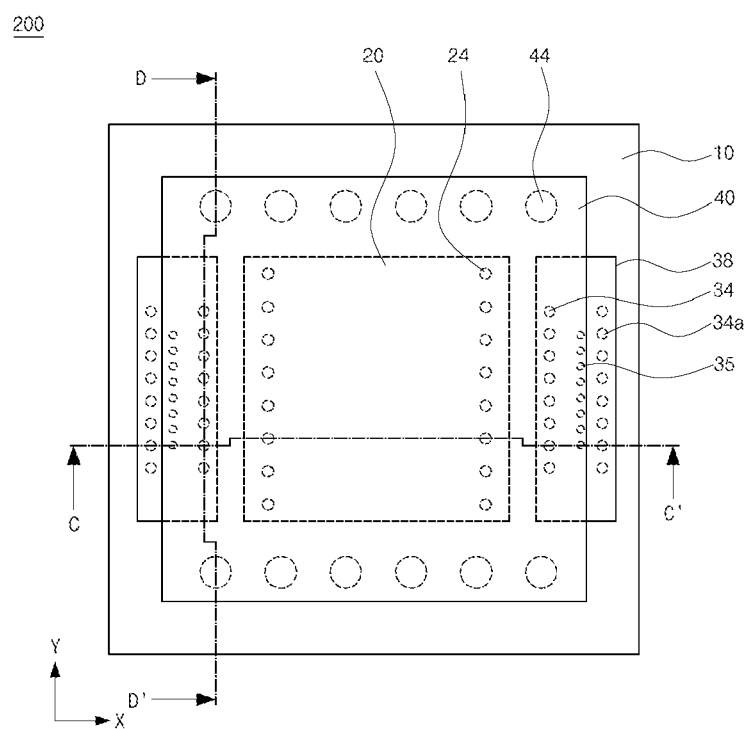
FIG. 4 is a plan view illustrating a representation of an example of a semiconductor package in accordance with an embodiment.
Figure 5:
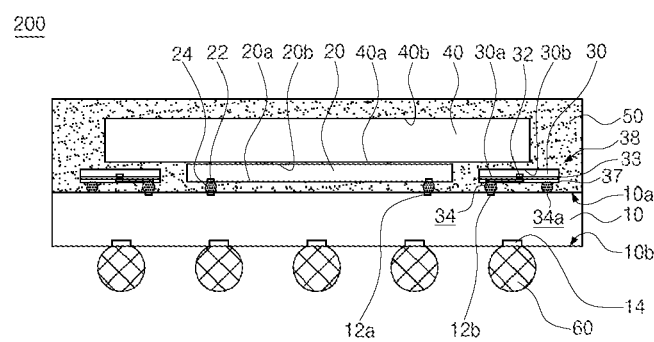
FIG. 5 is a cross-sectional view taken along the line C-C' of FIG. 4.
Figure 6:
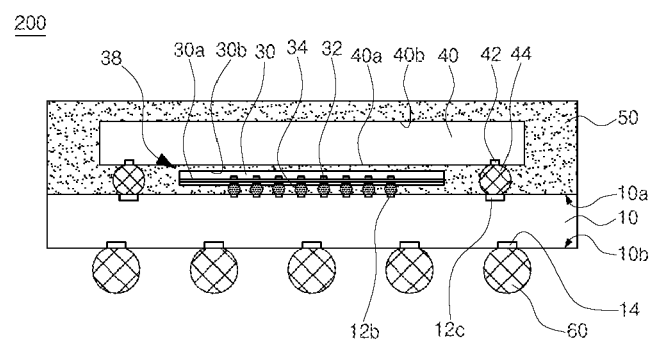
FIG. 6 is a cross-sectional view taken along the line D-D' of FIG. 4.

Referring to FIGS. 4 to 6, a semiconductor package 200 in accordance with an embodiment may include a substrate 10, a first semiconductor chip 20, wafer level packages 38, a third semiconductor chip 40, first to third connection members 24, 34 and 44, an encapsulation member 50, and external connection members 60.

The substrate 10 may be a printed circuit board. The substrate 10 may have a first surface 10a and a second surface 10b which faces away from the first surface 10a. The substrate 10 may include pluralities of first to third bond fingers 12a, 12b and 12c which are arranged on the first surface 10a, and a plurality of ball lands 14 which are arranged on the second surface 10b. The first bond fingers 12a may be arranged in a second direction Y perpendicular to a first direction X, along both ends of a portion of the first surface 10a of the substrate 10 on which the first semiconductor chip 20 is to be disposed, when viewed in the first direction X. The second bond fingers 12b may be arranged in the second direction Y along both ends of respective portions of the first surface 10a of the substrate 10 on which the wafer level packages 38 are to be respectively disposed, when viewed in the first direction X. The third bond fingers 12c may be arranged in the first direction X along both ends of a portion of the first surface 10a of the substrate 10 over which the third semiconductor chip 40 is to be disposed, when viewed in the second direction Y.

While not illustrated, the substrate 10 may include circuit patterns which are respectively formed on the first surface 10a and the second surface 10b and via patterns which are formed in the substrate 10. The substrate 10 may further include solder resists which are formed on the first surface 10a and the second surface 10b in such a way as to expose the first to third bond fingers 12a, 12b and 12c and the ball lands 14.

The first semiconductor chip 20 may be an SoC (system-on-chip). The first semiconductor chip 20 may have a first active surface 20a and a first bottom surface 20b which faces away from the first active surface 20a. The first semiconductor chip 20 may include a plurality of first bonding pads 22 which are arranged in the second direction Y along both ends of the first active surface 20a when viewed in the first direction X. The first semiconductor chip 20 may be flip-chip bonded to the first surface 10a of the substrate 10 by the first connection members 24 which are formed on the first bonding pads 22, such that the first active surface 20a faces the first surface 10a of the substrate 10.

The first connection members 24 may be bumps including copper pillars or solders. The first semiconductor chip 20 may be physically secured to the first bond fingers 12a of the substrate 10 by the first connection members 24, and may be electrically connected with the first bond fingers 12a of the substrate 10.

The wafer level packages 38 may be respectively disposed adjacent to both ends of the first semiconductor chip 20 when viewed in the first direction X, on the first surface 10a of the substrate 10. Each of the wafer level packages 38 may have a substantially rectangular plate shape. For example, each of the wafer level packages 38 may have a length shorter than the first semiconductor chip 20 in the first direction X, and may have substantially the same length as the first semiconductor chip 20 in the second direction Y.

Figure 7:
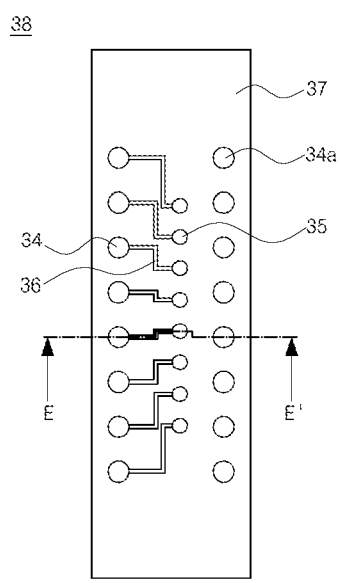
FIG. 7 is a bottom view illustrating a representation of an example of a wafer level package of the semiconductor package illustrated in FIG. 4.
Figure 8:
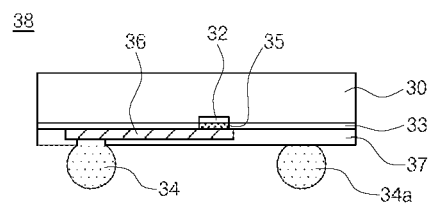
FIG. 8 is a cross-sectional view taken along the line E-E' of FIG. 7.

For example, referring to FIGS. 7 and 8, each of the wafer level packages 38 may include a second semiconductor chip 30. The second semiconductor chip 30 may be a memory chip. The second semiconductor chip 30 may have a second active surface 30a and a second bottom surface 30b which faces away from the second active surface 30a (see FIG. 5). The second semiconductor chip 30 may include a plurality of second bonding pads 32 which are arranged in the second direction Y along the middle portion of the second active surface 30a when viewed in the first direction X (see FIG. 4).

Each wafer level package 38 may include a first insulation layer 33 which is formed on the second active surface 30a of the second semiconductor chip 30 in such a way as to expose the second bonding pads 32. Also, the wafer level package 38 may include micro bumps 35 which are formed on the exposed second bonding pads 32. In an embodiment, the micro bumps 35 may be arranged with a pitch of approximately 20 to approximately 30 μm. Accordingly, it may be understood that the second bonding pads 32 of the second semiconductor chip 30 are also arranged with a pitch of approximately 20 to approximately 30 μm.

The wafer level package 38 may include, on the first insulation layer 33, redistribution lines 36 having one ends which are connected to the micro bumps 35. The redistribution lines 36 may be formed by depositing a metal layer with excellent electrical conductivity, such as copper, on the first insulation layer 33 including the micro bumps 35 and then patterning the metal layer. These redistribution lines 36 may be formed to solve a problem where the pitch of the micro bumps 35 is so fine that it may be difficult to directly connect the micro bumps 35 with the second bond fingers 12b of the substrate 10. That is to say, the redistribution lines 36 may route the micro bumps 35 to the second connection members 34 which will be described below, in such a manner that the micro bumps 35 may be easily connected to the substrate 10 (see FIG. 5).

The wafer level package 38 may include a second insulation layer 37 which is formed on the first insulation layer 33 in such a way as to expose the other ends of the redistribution lines 36.

The wafer level package 38 may include the second connection members 34 which are formed on the other ends of the redistribution lines 36 exposed out of the second insulation layer 37. The second connection members 34 may be arranged in the second direction Y along one end of the wafer level package 38 which is adjacent to the first semiconductor chip 20. The second connection members 34 may include bumps such as copper pillar bumps or solder bumps. In an embodiment, the second connection members 34 including bumps may be arranged with a pitch of approximately 120 to approximately 450 μm that is larger than the pitch of the micro bumps 35, to be easily connected to the substrate 10.

The wafer level package 38 may further include support members 34a which are arranged in the second direction Y along the other end of the wafer level package 38 opposite to the one end along which the second connection members 34 are arranged. The support members 34a are additionally formed to physically support the wafer level package 38, and may include, for example, bumps which are formed of the same material and have the same diameter as the second connection members 34. Thus, it may be understood that the support members 34a are not electrically connected with not only the second bonding pads 32 of the second semiconductor chip 30 but also the second bond fingers 12b of the substrate 10.

The wafer level package 38 may be flip-chip bonded to the first surface 10a of the substrate 10 by the second connection members 34 which are formed on the other ends of the redistribution lines 36 and include the support members 34a. In other words, the wafer level package 38 including the second semiconductor chip 30 may be physically secured to the first surface 10a of the substrate 10 by the second connection members 34 and the support members 34a, and the second bonding pads 32 of the second semiconductor chip 30 of the wafer level package 38 may be electrically connected with the second bond fingers 12b of the substrate 10 through the micro bumps 35, the redistribution lines 36 and the second connection members 34.

The third semiconductor chip 40 may be a memory chip. The third semiconductor chip 40 may have a substantially quadrangular plate shape. The third semiconductor chip 40 may be formed to have a size that covers the first semiconductor chip 20 and portions of the wafer level packages 38 which are adjacent to the first semiconductor chip 20. The third semiconductor chip 40 may have a third active surface 40a and a third bottom surface 40b which faces away from the third active surface 40a. The third semiconductor chip 40 may include a plurality of third bonding pads 42 which are arranged in the first direction X along both ends of the third active surface 40a when viewed in the second direction Y. The third semiconductor chip 40 may be flip-chip bonded to the first surface 10a of the substrate 10 by the third connection members 44 which are formed on the third bonding pads 42, such that the third active surface 40a faces the first surface 10a of the substrate 10, the first bottom surface 20b of the first semiconductor chip 20 and the second bottom surfaces 30b of the second semiconductor chips 30 of the wafer level packages 38.

The third connection members 44 may include solder balls. In an embodiment, the third connection members 44 including solder balls may be arranged with a pitch of approximately 120 to approximately 450 μm. Accordingly, the third semiconductor chip 40 may be physically secured to the third bond fingers 12c of the substrate 10 by the third connection members 44 including solder balls, and may be electrically connected with the third bond fingers 12c of the substrate 10.

Since the third connection members 44 are arranged with the pitch of approximately 120 to approximately 450 μm, it may be understood that the third bonding pads 42 of the third semiconductor chip 40 and the third bond fingers 12c of the substrate 10 are also arranged with a pitch of approximately 120 to approximately 450 μm.

The encapsulation member 50 may be formed of an epoxy molding compound. The encapsulation member 50 may be formed on the first surface 10a of the substrate 10 in such a way as to cover the first and third semiconductor chips 20 and 40 and the wafer level packages 38.

The external connection members 60 as means for mounting the semiconductor package 200 in accordance with the embodiment to an external circuit may be formed on the ball lands 14 which are arranged on the second surface 10b of the substrate 10. The external connection members 60 may include solder balls. In an embodiment, the external connection members 60 may include conductive pastes or conductive pins.

In the same manner as in the semiconductor package according to the aforementioned embodiments, in the semiconductor package in accordance with a present embodiment, since it is possible to obviate the need of forming TSVs for electrically connecting chips, various problems caused due to formation of TSVs may be solved.

The semiconductor package in accordance with a present embodiment has a hybrid POP (package-on-package) structure in which different kinds of chips are embedded and a plurality of packages are stacked. Therefore, the semiconductor package having the hybrid POP structure in accordance with a present embodiment may realize a semiconductor device which has a high capacity and is able to operate at a high speed.

The semiconductor packages in accordance with the above-described various embodiments may be applied to various kinds of semiconductor devices and package modules including the same.

Figure 9:
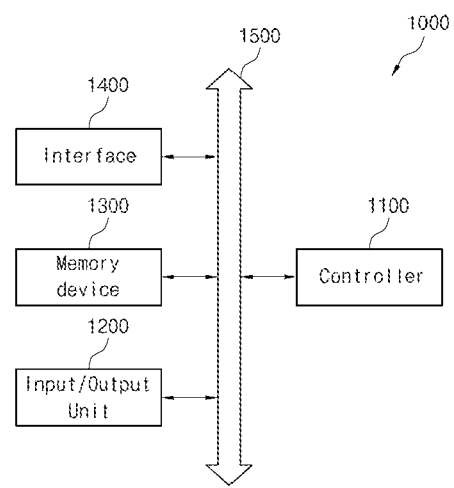
FIG. 9 is a block diagram illustrating a representation of an example of an electronic system to which the semiconductor packages in accordance with the various embodiments may be applied.

Referring to FIG. 9, an electronic system 1000 to which the semiconductor devices in accordance with the various embodiments may be applied may include a controller 1100, an input/output unit 1200, and a memory device 1300. The controller 1100, the input/output unit 1200 and the memory device 1300 may be coupled with one another through a bus 1500 which provides data movement paths.

For example, the controller 1100 may include at least any one of a microprocessor, a digital signal processor, a microcontroller, and logic devices capable of performing similar functions to these components. The controller 1100 and the memory device 1300 may include the semiconductor packages in accordance with the various embodiments. The input/output unit 1200 may include at least one selected among a keypad, a keyboard, a display device, and so forth.

The memory device 1300 may store data and/or commands to be executed by the controller 1100. The memory device 1300 may include a volatile memory device such as a DRAM and/or a nonvolatile memory device such as a flash memory. For example, a flash memory may be mounted to an information processing system such as a mobile terminal and a desktop computer. Such a flash memory may be configured by an SSD (solid state drive). In this case, the electronic system 1000 may stably store a large amount of data in a flash memory system.

Such an electronic system 1000 may further include an interface 1400 for transmitting data to a communication network or receiving data from a communication network. The interface 1400 may be a wired or wireless type. For example, the interface 1400 may include an antenna or a wired/wireless transceiver.

Although not illustrated, the electronic system 1000 may further include an application chipset, a camera image processor (CIP), and so forth.

The electronic system 1000 may be realized as a mobile system, a personal computer, a computer for an industrial use or a logic system which performs various functions. For example, the mobile system may be any one among a personal digital assistant (PDA), a portable computer, a web tablet, a mobile phone, a smart phone, a wireless phone, a laptop computer, a memory card, a digital music system and an information transmission/reception system.

In the case where the electronic system 1000 is equipment capable of performing wireless communication, the electronic system 1000 may be used in a communication system such as CDMA (code division multiple access), GSM (global system for mobile communication), NADC (North American digital cellular), E-TDMA (enhanced-time division multiple access), WCDMA (wideband code division multiple access), CDMA2000, LTE (long term evolution) and Wibro (wireless broadband Internet).

Figure 10:
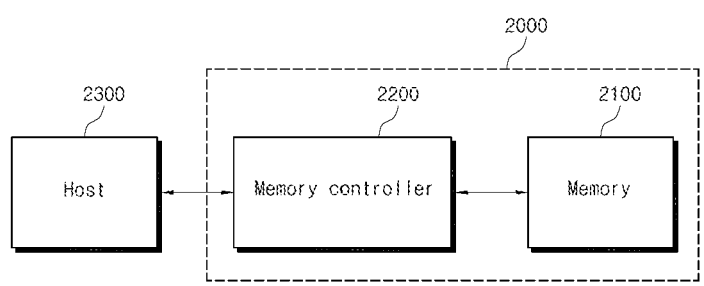
FIG. 10 is a block diagram illustrating a representation of an example of a memory card which may include the semiconductor packages in accordance with the various embodiments.

Referring to FIG. 10, a memory card 2000 may include the package-on-package type semiconductor devices in accordance with the various embodiments. The memory card 2000 may include a memory 2100 and a memory controller 2200. For example, without a limiting sense, the memory 2100 and the memory controller 2200 may include a nonvolatile memory device. The memory 2100 and the memory controller 2200 may store data or read stored data.

The memory 2100 may include at least any one among nonvolatile memory devices to which the semiconductor packages in accordance with the embodiments are applied.

The memory controller 2200 may control the memory 2100 to read stored data or store data, in response to a read/write request from a host 2300.

While various embodiments have been described above, it will be understood to those skilled in the art that the embodiments described are by way of example only. Accordingly, the semiconductor package embedded with a plurality of chips described herein should not be limited based on the described embodiments.

What is claimed is:

1. A semiconductor package comprising:
   a substrate;
   a first semiconductor chip flip-chip bonded to a first surface of the substrate;
   second semiconductor chips respectively flip-chip bonded to portions of the first surface of the substrate adjacent to both ends of the first semiconductor chip in a first direction; and
   a third semiconductor chip solder-jointed to the first surface of the substrate as to completely cover the first semiconductor chip and partially covering portions of the second semiconductor chips,
   wherein the third semiconductor chip has a first active surface facing the first surface of the substrate, the first semiconductor chip and the second semiconductor chips, and a first bottom surface facing away from the first active surface, and comprises a plurality of first bonding pads which are arranged in the first direction along both ends of a second direction substantially perpendicular to the first direction of the first active surface and the first connection members formed on the first bonding pads,
   wherein the third semiconductor chip is directly jointed to the first surface of the substrate by the first connection members.

2. The semiconductor package according to claim 1, wherein the substrate comprises:
   pluralities of first to third bond fingers arranged on the first surface;
   a plurality of ball lands arranged on a second surface facing away from the first surface; and
   solder resists respectively formed on the first surface and the second surface in such a way as to expose the first to third bond fingers and the ball lands.

3. The semiconductor package according to claim 2,
   wherein the first bond fingers are arranged in the second direction along both ends of a center portion of the first surface of the substrate on which the first semiconductor chip is disposed,
   wherein the second bond fingers are arranged in the second direction along both ends of the respective portions of the first surface of the substrate on which the second semiconductor chips are respectively disposed, and
   wherein the third bond fingers are arranged in the first direction along both ends of a portion of the first surface of the substrate over which the third semiconductor chip is disposed.

4. The semiconductor package according to claim 1, wherein the first semiconductor chip comprises an SoC (system-on-chip) which has a substantially quadrangular plate shape.

5. The semiconductor package according to claim 1, wherein the first semiconductor chip has a second active surface facing the first surface of the substrate and a second bottom surface facing away from the second active surface, and comprises a plurality of second bonding pads arranged in the second direction substantially perpendicular to the first direction along both ends of the second active surface.

6. The semiconductor package according to claim 5, wherein the first semiconductor chip further comprises second connection members formed on the second bonding pads.

7. The semiconductor package according to claim 6, wherein the second connection members comprise bumps.

8. The semiconductor package according to claim 1, wherein each of the second semiconductor chips has a second active surface facing the first surface of the substrate and a second bottom surface facing away from the second active surface, and comprises a plurality of second bonding pads arranged in the second direction substantially perpendicular to the first direction along both ends of the second active surface.

9. The semiconductor package according to claim 8, wherein each of the second semiconductor chips further comprises second connection members formed on the second bonding pads.

10. The semiconductor package according to claim 9, wherein the second connection members comprise bumps.

11. The semiconductor package according to claim 9, wherein the second connection members comprising the bumps are arranged with a pitch of approximately 50 μm to approximately 100 μm.

12. The semiconductor package according to claim 9, wherein the first semiconductor chip has a third active surface facing the first surface of the substrate and a third bottom surface facing away from the third active surface, and comprises a plurality of third bonding pads arranged in the second direction substantially perpendicular to the first direction along both ends of the third active surface, wherein the first semiconductor chip further comprises third connection members formed on the third bonding pads, wherein the third connection members have substantially the same diameter as the second connection members, and wherein the second connection members have a pitch shorter than the third connection members.

13. The semiconductor package according to claim 1, wherein the first connection members comprise solder balls.

14. The semiconductor package according to claim 13,
    wherein the first connection members comprising the solder balls are arranged with a pitch of approximately 120 μm to approximately 450 μm.

15. The semiconductor package according to claim 1,
    wherein the first semiconductor chip has a second active surface facing the first surface of the substrate and a second bottom surface facing away from the second active surface, and comprises a plurality of second bonding pads arranged in the second direction substantially perpendicular to the first direction along both ends of the second active surface,
    wherein the first semiconductor chip further comprises second connection members formed on the second bonding pads,
    wherein the first connection members are arranged with a pitch greater than a pitch of the second connection members.

16. The semiconductor package according to claim 1, further comprising:
    an encapsulation member formed on the first surface of the substrate to cover the first to third semiconductor chips; and
    a plurality of external connection members formed on a second surface of the substrate facing away from the first surface.

17. The semiconductor package according to claim 1,
wherein the first semiconductor chip includes a logic chip,
wherein the second semiconductor chips include memory chips, and
wherein the third semiconductor chip comprises a memory chip.

18. The semiconductor package according to claim 1,
wherein each of the second semiconductor chips have a substantially rectangular plate shape having a length shorter than the first semiconductor chip in the first direction, and having substantially the same length as the first semiconductor chip in the second direction.

\* \* \* \* \*